(12) United States Patent
Busier

(10) Patent No.: US 7,279,983 B2
(45) Date of Patent: Oct. 9, 2007

(54) OUTPUT AMPLIFIER STRUCTURE WITH BIAS COMPENSATION

(75) Inventor: Mark J. Busier, Gilbert, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 203 days.

(21) Appl. No.: 11/282,021

(22) Filed: Nov. 18, 2005

(65) Prior Publication Data

US 2007/0115067 A1    May 24, 2007

(51) Int. Cl.
*H03F 3/04*    (2006.01)
(52) U.S. Cl. .................................................. 330/307
(58) Field of Classification Search ................ 330/307, 330/65–68
See application file for complete search history.

(56) References Cited

U.S. PATENT DOCUMENTS

| | | | | |
|---|---|---|---|---|
| 4,523,243 | A * | 6/1985 | Billington | 360/327.24 |
| 5,796,165 | A * | 8/1998 | Yoshikawa et al. | 257/728 |
| 6,301,122 | B1 * | 10/2001 | Ishikawa et al. | 361/794 |

OTHER PUBLICATIONS

Application Note "AND8196/D ThermalTrak Audio Output Transistors", Jan. 2005—Rev. O, Semiconductor Components Industries, LLC, 2005.
EETIMES, "ON Semi's Output audio transistor eliminate thermal lag and bias in high-fidelity amps", by Bettyann Liotta, eeProduct Center, Jan. 6, 2005.
Product Brochure, "Electronic Polymers for Semiconductor Packaging", STAYSTIK Thermoplastic Adhesives, STAYDRY Getter Materials, STAYCHIP Underfills, POLYSOLDER Conductive Adhesives, Cookson Electronics (undated).
Planet Analog "to bias or not bias: New audio output transistors make that decision easy", by Mark Busier, Product Applications Engineer, On Semiconductor, Phoenix, Jan. 10, 2005.
On Semiconductor website, Press Room, Product News, "ON Semiconductor's ThermalTrak Devices Eliminate Thermal Lag and Bias Trimming in the Audio Output of High Fidelity Amplifiers", International Consumer Electronics Showcase (CES)—Las Vegas, Nevada—Jan. 6, 2005.

* cited by examiner

*Primary Examiner*—Robert Pascal
*Assistant Examiner*—Alan Wong
(74) *Attorney, Agent, or Firm*—Kevin B. Jackson

(57) ABSTRACT

In one embodiment, an output transistor and a bias compensation device are placed in proximity to each other on the same package substrate. The bias compensation device is electrically isolated but thermally coupled to the output transistor, and is configured to provide a output signal for adjusting bias to the output transistor.

20 Claims, 3 Drawing Sheets

US 7,279,983 B2

OUTPUT AMPLIFIER STRUCTURE WITH BIAS COMPENSATION

FIELD OF THE INVENTION

This invention relates generally to electronic devices, and more specifically to packaged semiconductor devices with bias compensation.

BACKGROUND OF THE INVENTION

In audio output applications, output amplifier device overheating often leads to increased harmonic distortion, and can potentially cause a catastrophic failure of an end product. To address this problem, designers have traditionally mounted a separately packaged bias protection or compensation device to a heat sink in close proximity to a separately packaged output amplifier device. One problem with this approach occurs because a period of time must pass before thermal equilibrium is achieved. This period of time may be as long as thirty minutes, and is referred to as "warm-up" time. Also, this approach is susceptible to moisture aging problems and mechanical contact degradation. Additionally, many designers design the circuits to slightly under bias the output amplifier to reduce the potential for thermal runaway. Both of these approaches take away from the true high fidelity performance of the output amplifier device.

Accordingly, a need exists for a structure and method of manufacture to more efficiently and accurately provide bias protection or compensation for output amplifier devices, and that overcome the deficiencies of the prior art.

DETAILED DESCRIPTION OF THE DRAWINGS

Figure 1:
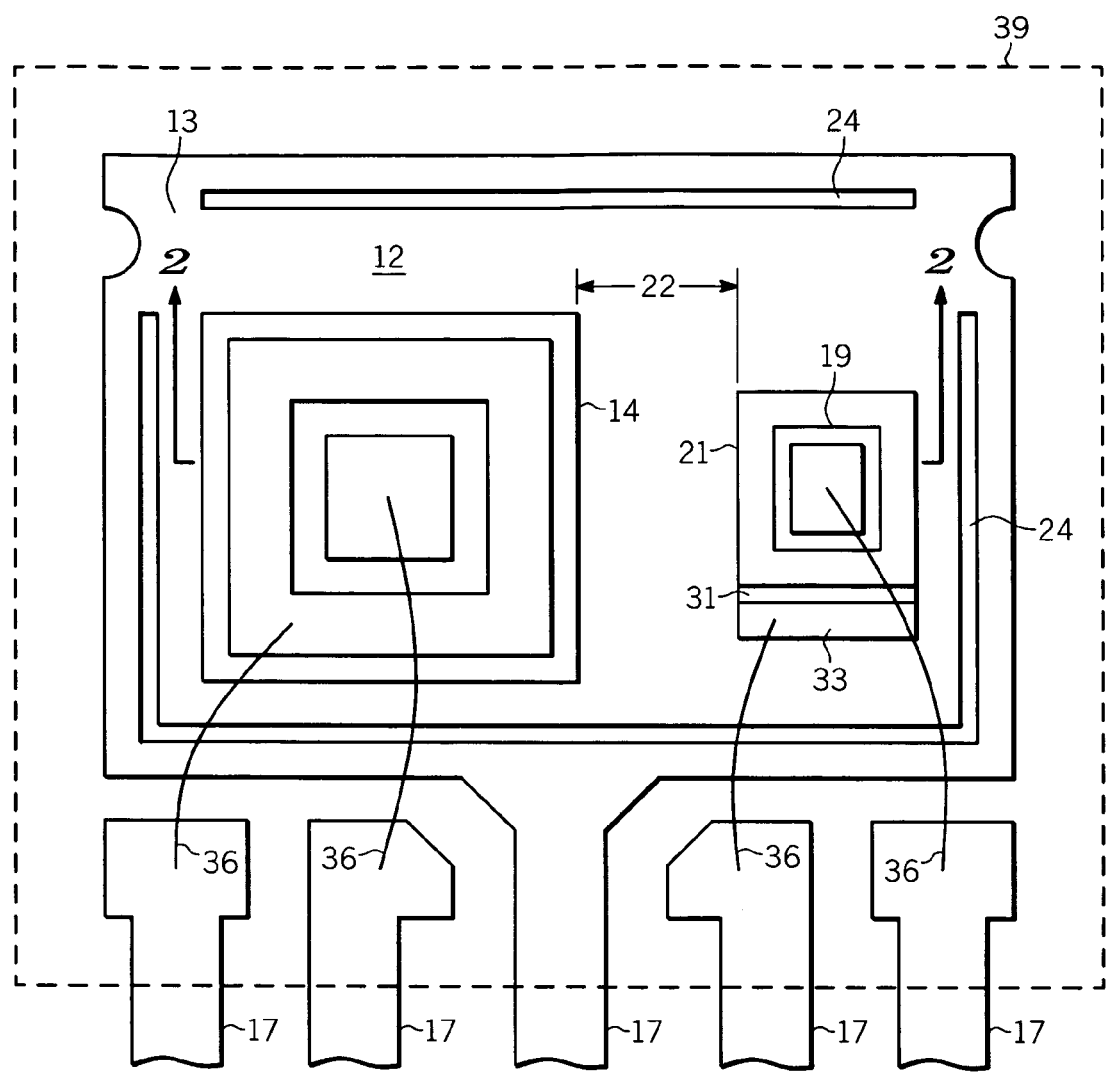
FIG. 1 illustrates a partial top view of a semiconductor structure in accordance with the present invention.

For ease of understanding, elements in the drawing figures are not necessarily drawn to scale, and like element numbers are used where appropriate throughout the various figures to denote the same or similar elements. Although the present invention is illustrated as a TO-264 packaged device, those skilled in the art will appreciate that the present invention may be incorporated into other types of semiconductor or electronic packages.

FIG. 1 shows a partial top view of a semiconductor structure, audio amplifier device with bias compensation, or bias compensated output amplifier structure 10 in accordance with the present invention. Amplifier structure 10 includes a package substrate, flag, or die attach paddle 12, which is configured to hold a plurality of semiconductor devices or components. Flag 12 has a major surface 13 and comprises a material that is at least thermally conductive, and in one embodiment is also electrically conductive.

Amplifier structure 10 further includes a plurality of conductive leads 17 in spaced relationship to, in close proximity with and/or attached to flag 12. In the example shown, one of conductive leads 17 is shown attached or integral with flag 12, and provides for bias to one or more devices or components attached to and in electrical contact with flag 12. In one embodiment, flag 12 and leads 17 comprise a copper alloy (e.g., TOMAC 4, TAMAC 5, 2ZFROFC, or CDA194), a copper plated iron/nickel alloy (e.g., copper plated Alloy 42), plated aluminum, plated plastic, or the like. Plated materials include copper, silver, or multi-layer plating such nickel-palladium and/or gold.

Figure 2:
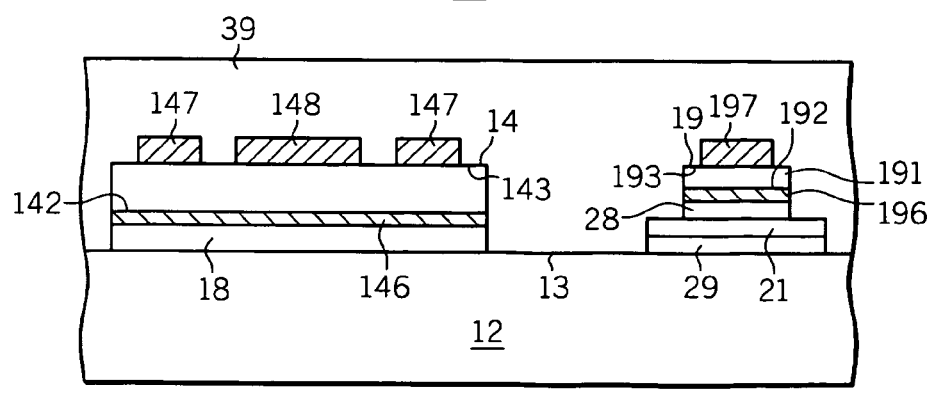
FIG. 2 illustrates a partial cross-sectional view of the semiconductor structure of FIG. 1 taken along reference line 2-2.

A first semiconductor device, output amplifier device, output transistor, device requiring bias compensation or switching device 14 is attached to a portion of flag 12 using a solder attach layer or a thermally and electrically conductive epoxy layer 18 (shown in FIG. 2). In one embodiment, output amplifier device 14 comprises a bipolar power transistor. By way of example, output amplifier device 14 comprises a 100 to 250 volt, 150 to 250 watt NPN or PNP bipolar transistor. By way of example, attach layer 18 comprises a soft solder such as a lead/tin or lead free solder.

A second, separate, or non-integrated semiconductor device, bias compensation device, or thermal bias device 19 is coupled to another portion of flag 12. In accordance with the present invention, bias compensation device 19 is thermally coupled to flag 12, but electrically isolated therefrom. By way of example, bias compensation device 19 is attached to a conductive slug, platform, pedestal, or structure 21 using a solder attach layer or a thermally and electrically conductive epoxy layer 28 (shown in FIG. 2). Slug 21 comprises, for example, a copper alloy (e.g., TOMAC 4, TAMAC 5, 2ZFROFC, or CDA194), a copper plated iron/nickel alloy (e.g., copper plated Alloy 42), plated aluminum, plated plastic, or the like. Plated materials include copper, silver, or multi-layer plating such nickel-palladium and/or gold.

Further, in accordance with the present invention, slug 21 is attached to flag 12 using a thermally conductive and electrically insulative or isolative attach layer 29. By way of example, attach layer 29 comprises an epoxy attach layer such as a thermoplastic adhesive comprised of aluminum nitride or boron nitride. By way of example, attach layer 29 comprises a thermoplastic adhesive having a thermal conductivity from about 0.25 Watts/meter-Kelvin to about 1.5 W/m·K, and a volume resistivity greater than about $1.0 \times 10^9$ ohm-cm. In a preferred embodiment, attach layer comprises a thermoplastic adhesive having a thermal conductivity from about 0.25 W/m·K to about 0.5 W/m·K, and volume resistivity greater than about $1.0 \times 10^9$ ohm-cm. In one embodiment, attach layer 29 has thickness in a range from 25 microns to about 150 microns. Attach layer 29 electrically isolates bias compensation device 19 from flag 12 and output amplifier 14, but provides or allows for thermal conductance, contact, coupling, or transmission between bias compensation device 19, flag 12 and output amplifier 14.

Bias compensation device 19 comprises a device having a desired electrical or current/voltage (I/V) response as a function of temperature. In one embodiment, bias compensation device 19 comprises a device having an I/V characteristic similar to the I/V characteristic of the base-emitter junction of output amplifier 14. For example, bias compensation device 19 comprises a forward biased diode device where the forward I/V characteristic substantially tracks the I/V characteristic of the forward biased base-emitter junction of output amplifier 14 when in operation. In a preferred embodiment, bias compensation device 19 comprises an ultra-fast switching rectifier (UFR) diode having a breakdown voltage of approximately 200 volts. By way of example, the UFR diode is approximately 1.5 millimeters by 1.5 millimeters.

In accordance with the present invention, bias compensation device 19 is separated, discrete from, or non-monolithically integrated with output amplifier device 14, but is contained within the same package 10. In one embodiment, bias compensation device 19 is spaced a distance 22 from output amplifier device 14 of about $3.50 \times 10^{-3}$ meters to about $4.0 \times 10^{-3}$ meters. This distance provides amplifier device 10 with a good temperature hysteresis effect when amplifier device 10 is in operation. Bias compensation device 19 is placed closer to output amplifier device 14 than in prior art configurations where the separately packaged bias compensation devices is external to the separately packaged output amplifier on the same heat sink. This substantially reduces the "warm-up" time required to reach thermal equilibrium, and further avoids the overheating problems encountered with prior art designs, which result in harmonic distortion and/or catastrophic failure of expensive end products. The present invention also eliminates the moisture aging and mechanical contact issues associated with the prior art. Further, audio output applications amplifier device 10 eliminates the need for bias trimming potentiometers, bias transistors, and standard resistors in bias tracking circuitry. This reduces manufacturing cycle time and expense, and further guarantees that a quiescent bias point is reach during operation. Moreover, because bias compensation device 19 is placed in proximity to output amplifier 14 more precise detection of thermal perturbations occurs, which improves both sound quality and bias stability in output amplifier applications.

FIG. 1 further shows flag 12 with optional mold locks or slots 24. Also, slug 21 is shown with an optional trench 31, which acts to prevent, reduce, or control the flow of die attach material across slug 21 when bias compensation device 19 is attached to slug 21. Slug 21 is further shown with a bonding portion 33, which provides a place or location for attaching a conductive structure 36. Conductive structures 36 electrically couple output amplifier 14 and bias compensation device 19 to selected or desire conductive leads 17. By way of example, conductive structures 36 comprise wire bonds, clips, or straps or combinations thereof. It is understood that the type and diameter of conductive structures 36 are chosen depending on the power requirements of the devices. For example, in one embodiment, conductive structures 36 attached to output amplifier 14 comprise aluminum wires about 15 mils in diameter, and conductive structures 36 attached to bias compensation device 19 comprise aluminum wire about 5 mils in diameter. A passivating or molded encapsulating layer 39 is formed over all or a portion of flag 12, first and second semiconductor components 14 and 19, and portions of conductive leads 17.

FIG. 2 shows a partial cross-sectional view of amplifier device 10 taken along reference line 2-2 in FIG. 1. Output amplifier device 14 comprises a semiconductor substrate 141 having opposing major surfaces 142 and 143. In one embodiment, a conductive layer 146 is formed overlying major surface 142, which forms a bond or connection to attach layer 18. Conductive layers 147 and 148 are formed overlying major surface 143 and provide, for example, electrical connection to device regions formed within output amplifier device 14. By way of example, conductive layer 147 is a control electrode, and conductive layers 148 and 146 are current carrying electrodes. Conductive layers 147 and 148 comprise, for example, aluminum or an aluminum alloy such as aluminum-silicon, aluminum-silicon-copper, or the like. Conductive layer 146 comprises, for example, a multilayer structure such as titanium-nickel-silver, chrome-nickel-gold, or the like.

Bias compensation device 19 comprises a semiconductor substrate 191 having opposing major surfaces 192 and 193. In one embodiment, a conductive layer 196 is formed overlying major surface 192 to form a cathode contact and couples semiconductor substrate 191 to die attach layer 28. Conductive layer 196 comprises, for example, similar materials to those described for conductive layer 146. A conductive layer 197 is formed overlying major surface 193, and provides an anode contact. Conductive layer 197 comprises, for example, aluminum, an aluminum alloy such as aluminum-silicon, aluminum-silicon-copper, or the like.

Figure 3:
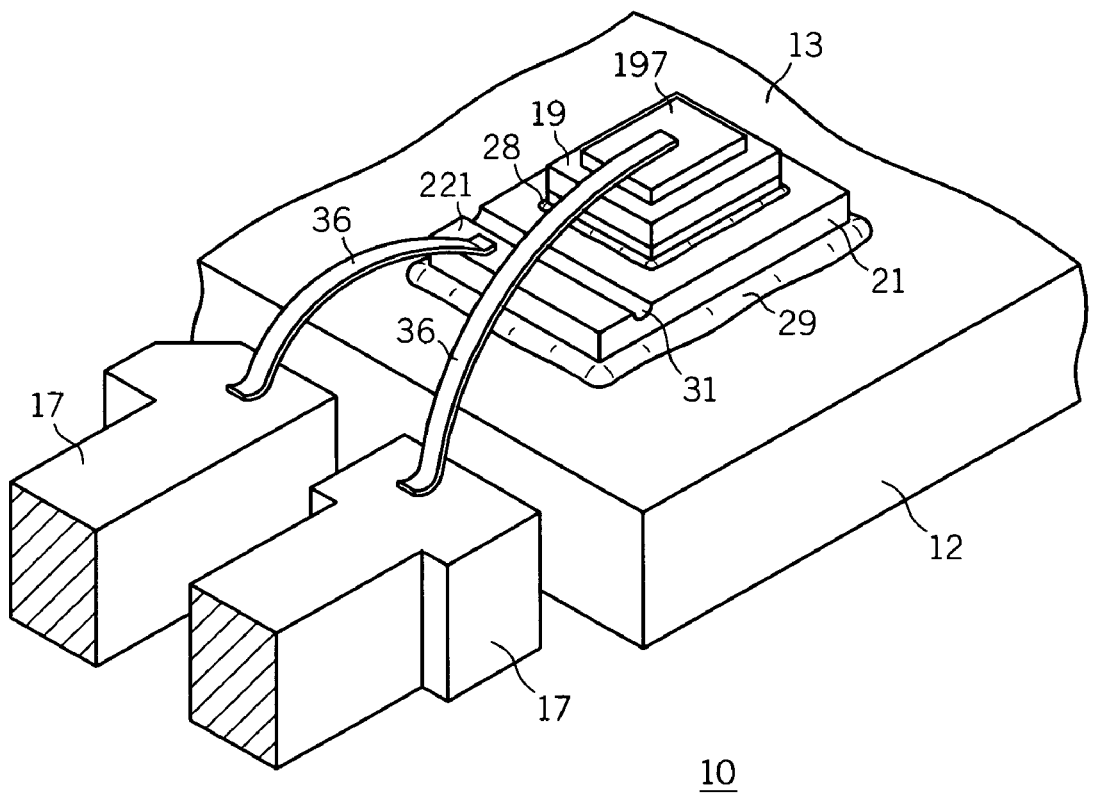
FIG. 3 illustrates a partial isometric view of a portion of the semiconductor structure of FIG. 1.

Turning now to FIG. 3, a portion of device 10 is shown in an isometric view. In this view, encapsulation layer 39 is not shown so as to better illustrate other aspects of the present invention. In this view slug 21 is shown attached to flag 12 using thermally conductive and electrically insulative attach layer 29. Additionally, slug 21 is shown with optional structure 31, which prevents flow of material from attach layer 28 to a portion 221 of slug 21 where conductive structure 36 attached to slug 21. By way of example, structure 31 comprises an etched for formed trench or indentation. This provides for improved bonding capabilities.

Figure 4:
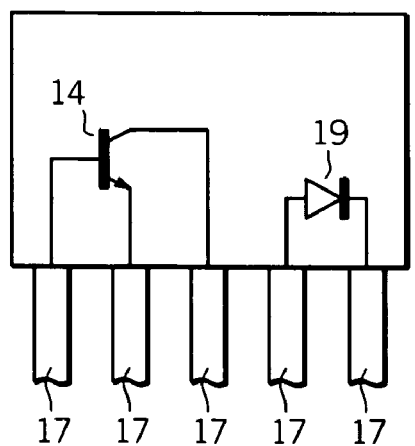
FIG. 4 illustrates a circuit schematic of an embodiment of the present invention.

FIG. 4 shows a circuit schematic example of device 10 in the TO-264 configuration where amplifier device 14 comprises an NPN bipolar transistor and bias compensation device 19 is an ultra fast switching diode thermally coupled to amplifier device 14, but electrically isolated from amplifier device 14. By thermally integrating bias compensation device 19 with amplifier device 14, the actual die temperature of device 14 is precisely monitored real-time. When this is done in an application, the bias of amplifier device is controlled internally to device 10, and changes are compensated for on a real time basis. As a result, an instantly trimmed bias current is provided, which does not allow for thermal runaway or thermal lag due to the mass of a heatsink as in the prior art.

Figure 5:
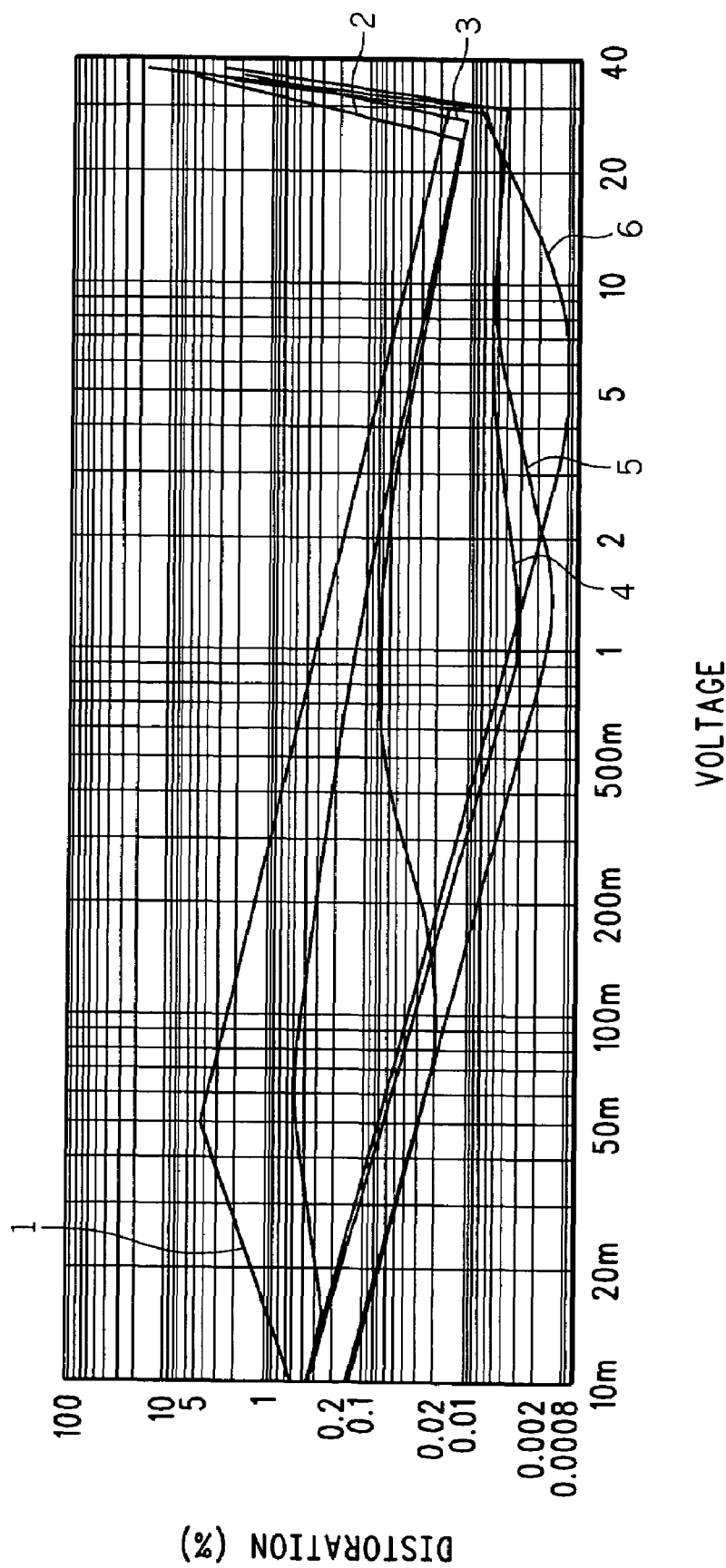
FIG. 5 is a graph showing total harmonic distortion performance of the semiconductor structure of the present invention.

FIG. 5 is graph showing performance improvements of the present invention compared to a typical prior art design. In particular, FIG. 5 shows total harmonic distortion (THD) performance as measured by an Audio Precision analyzer with the following load conditions: 4 ohm non-inductive resistor for sweep 1, and no load for sweeps 2 and 3. Curve 1 represents a prior art structure with a standard externally mounted bias transistor technology and Curve 2 represents the present invention with internal diode compensation for sweep 1 at 10 kHz at a load of 4 ohms. Curve 3 is the prior art structure described above and Curve 4 is the present invention at 10 kHz and no load. Curve 5 is the prior art structure described above and Curve 6 is the present invention at 1 kHz and no load.

With the present invention, the quiescent bias voltage is raised to about 3.4 volts, and lower distortion performance is achieved without any thermal lag issues. Additionally, the present invention was found to be completely stable with a 2 ohm load without any bias current creep, which typically is caused by temperature differences between power components or thermal shock. Additionally, as shown in FIG. 5, a large improvement in distortion performance is achieved using the present invention with most of the improvements being in the region of lower power output voltages where a majority of the lower level musical content exists. It should also be noted that the present invention provides a bias control that is more active over a wider range, and there is virtually no warm-up time.

Thus, it is apparent that there has been provided, in accordance with the present invention, an output amplifier structure including an amplifier device and a bias compensation device within the same package. The bias compensation device is non-monolithically integrated with the amplifier and is spaced a distance from it. Further, the bias compensation device is electrically insulated but thermally coupled with the amplifier device. The amplifier structure of the present invention provides an improved dynamic temperature response, which improves sound quality. Additionally, the present invention eliminates the need for other bias correction devices such as trim resistors, bias transistors, and standard resistors, which reduces manufacturing cycle time and expense.

Although the invention has been described and illustrated with reference to specific embodiments thereof, it is not intended that the invention be limited to these illustrative embodiments. For example, more than one output amplifier device and/or more than one bias compensation device may be included with amplifier device 10.

What is claimed is:

1. An output amplifier structure comprising:
   a flag having a major surface;
   an amplifier device electrically and thermally coupled to one portion of the flag;
   a bias compensation device for sensing thermal characteristics of the amplifier device coupled to another portion of the flag and spaced apart from the amplifier device, wherein the bias compensation device is thermally coupled to the flag and electrically isolated from the flag;
   a plurality of conductive leads in proximity to the flag;
   connective structures electrically coupling the amplifier device and the bias compensation device to the plurality of conductive leads; and
   an encapsulating layer formed overlying the amplifier device and the bias compensation device.

2. The structure of claim 1, wherein the amplifier device comprises a bipolar transistor.

3. The structure of claim 2, wherein the bias compensation device comprises a diode.

4. The structure of claim 3, wherein the diode comprises an ultra-fast diode.

5. The structure of claim 1, wherein the bias compensation device is attached to the flag with an attach layer having a thermal conductivity from about 0.25 W/m·K to about 0.5 W/m·K, and volume resistivity greater than about $1.0 \times 10^9$ ohm-cm.

6. The structure of claim 1, wherein the bias compensation device is spaced a distance from about $3.5 \times 10^{-3}$ meters to about $4.0 \times 10^{-3}$ meters from the amplifier device.

7. The structure of claim 1, wherein the bias compensation is electrically coupled to a conductive slug, and wherein the conductive slug is thermally coupled to the flag but electrically isolated therefrom.

8. The structure of claim 7, wherein the conductive slug is electrically coupled to one of the plurality of conductive leads.

9. The structure of claim 7, wherein the conductive slug includes a structure for preventing flow of attach material.

10. An amplifier device with bias compensation comprising:
    a die attach paddle having a major surface, wherein the die attach paddle is electrically and thermally conductive;
    a plurality of conductive leads in spaced relationship to the die attach paddle;
    an output switching device electrically and thermally couple to one portion of the die attach paddle and further electrically coupled to at least one of the plurality of conductive leads;
    a thermal bias device thermally coupled to the die attach paddle and spaced a distance from the output switching device, the thermal bias device for sensing temperature changes bias in the output switching device and providing the bias compensation therefore, wherein the thermal bias device is electrically isolated from the die attach paddle; and
    an encapsulating layer passivating the output switching device and the thermal bias device.

11. The device of claim 10, wherein the output switching device comprises a bipolar transistor.

12. The device of claim 10, wherein the thermal bias device comprises a diode.

13. The device of claim 10, wherein the thermal bias device comprises an ultra-fast switching diode.

14. The device of claim 10, wherein the thermal bias device is coupled to an electrically and thermally conductive slug, and wherein the conductive slug is thermally coupled to the die attach paddle and electrically isolated from the die attach paddle.

15. The device of claim 14, wherein the conductive slug is attached to the die attach paddle with a die attach epoxy layer that is electrically isolative and thermally conductive.

16. A method for forming an amplifier device comprising the steps of:
    providing a die attach paddle having a major surface, wherein the die attach paddle is electrically and thermally conductive, and having a plurality of conductive leads in spaced relationship thereto;
    attaching an output switching device to one portion of the die attach paddle with an electrically and thermally conductive attach layer;
    attaching a thermal bias device to another portion of the die attach paddle and spaced a distance from the output switching device with a thermally conductive and electrically isolative attach layer;
    coupling the output switching device and the thermal bias device to the plurality of conductive leads; and
    forming an encapsulating layer overlying the output switching device and the thermal bias device.

17. The method of claim 16, wherein the step of attaching the output switching device includes attaching a bipolar transistor.

18. The method of claim 16, wherein the step of attaching the thermal bias device includes attaching an ultra-fast switching diode.

19. The method of claim 16, wherein the step of attaching the thermal bias device includes attaching the thermal bias device a distance from about $3.5 \times 10^{-3}$ meters to about $4.0 \times 10^{-3}$ meters from the output switching device.

20. The method of claim 16, further comprising the step of attaching the thermal bias device to an electrically and thermally conductive slug, and attaching the conductive slug to the die attach paddle with the thermally conductive and electrically isolative attach layer.

* * * * *